United States Patent
Lee

(10) Patent No.: US 10,110,223 B2
(45) Date of Patent: Oct. 23, 2018

(54) SINGLE ENDED-TO-DIFFERENTIAL CONVERTER

(71) Applicant: VIA Alliance Semiconductor Co., Ltd., Shanghai (CN)

(72) Inventor: Yeong-Sheng Lee, Fremont, CA (US)

(73) Assignee: VIA ALLIANCE SEMICONDUCTOR CO., LTD., Shanghai (CN)

(*) Notice: Subject to any disclaimer, the term of this patent is extended or adjusted under 35 U.S.C. 154(b) by 244 days.

(21) Appl. No.: 15/203,392

(22) Filed: Jul. 6, 2016

(65) Prior Publication Data
US 2018/0013423 A1    Jan. 11, 2018

(51) Int. Cl.
| | |
|---|---|
| *H03K 3/00* | (2006.01) |
| *H03K 17/687* | (2006.01) |
| *H03K 5/151* | (2006.01) |
| *H03K 5/135* | (2006.01) |
| *H03K 5/156* | (2006.01) |

(52) U.S. Cl.
CPC ......... *H03K 17/6872* (2013.01); *H03K 5/135* (2013.01); *H03K 5/151* (2013.01); *H03K 5/1565* (2013.01)

(58) Field of Classification Search
CPC .................................................. H03K 17/6872
USPC ................................ 327/306, 170, 172–176
See application file for complete search history.

(56) References Cited

U.S. PATENT DOCUMENTS

| | | | |
|---|---|---|---|
| 8,471,617 B2 | 6/2013 | Choi | |
| 2005/0007168 A1* | 1/2005 | Park | H03K 5/1565 327/175 |
| 2007/0080728 A1 | 4/2007 | Iwata | |
| 2008/0101524 A1 | 5/2008 | Jeong et al. | |
| 2009/0058483 A1 | 3/2009 | Shin et al. | |
| 2010/0117702 A1 | 5/2010 | Jang et al. | |

FOREIGN PATENT DOCUMENTS

WO    WO 2007/146590 A2    12/2007

OTHER PUBLICATIONS

European Search Report dated May 23, 2017, issued in application No. 16200684.5-1809.
European Search Report dated May 29, 2017, issued in application No. 16199007.2-1810.
Yeo, K.S., et al.; "Non-sequential linear CMOS phase detector for CDR applications;" IEE Proceedings—Circuits Devices and Systems; vol. 152; No. 6; Dec. 2005; pp. 667-672.
(Continued)

*Primary Examiner* — Thomas Skibinski
(74) *Attorney, Agent, or Firm* — McClure, Qualey & Rodack, LLP

(57) ABSTRACT

A single-ended-to-differential converter for driving an LVDS (Low Voltage Differential Signaling) driving circuit includes a first converting circuit, a second converting circuit, and a controller. The first converting circuit converts an input signal into a first output signal. The first converting circuit has a tunable delay time. The second converting circuit converts the input signal into a second output signal. The second converting circuit has a fixed delay time. The controller generates a first control signal and a second control signal according to the first output signal and the second output signal, so as to adjust the tunable delay time of the first converting circuit.

13 Claims, 12 Drawing Sheets

(56) References Cited

OTHER PUBLICATIONS

Moon, Y., et al.; "An all-analog multiphase delay-locked loop using a replica delay line for wide-range operation and low-jitter performance;" IEEE Journal of Solid-State Circuits; vol. 35; No. 3; Mar. 2000; pp. 377-384.

* cited by examiner

SINGLE ENDED-TO-DIFFERENTIAL CONVERTER

BACKGROUND OF THE INVENTION

Field of the Invention

The disclosure generally relates to a single-ended-to-differential converter, and more specifically, to a single-ended-to-differential converter applied to an LVDS (Low Voltage Differential Signaling) driving circuit.

Description of the Related Art

Differential signaling circuits are very popular, being used in data transmission nowadays, including LVDS (Low Voltage Differential Signaling), HDMI (High-Definition Multimedia Interface), USB (Universal Serial Bus), etc. Differential signaling circuits have advantages that include saving power and reducing noise.

However, general logic circuits arranged for controlling the differential signaling circuits are single-ended, and they cannot provide differential control signals. Accordingly, there is a need to design a single-ended-to-differential converter for adapting the logic circuits to the differential signaling circuits

BRIEF SUMMARY OF THE INVENTION

In a preferred embodiment, the invention is directed to a single-ended-to-differential converter for driving an LVDS (Low Voltage Differential Signaling) driving circuit according to an input signal, including: a first converting circuit, converting the input signal into a first output signal, wherein the first converting circuit has a tunable delay time; a second converting circuit, converting the input signal into a second output signal, wherein the second converting circuit has a fixed delay time; and a controller, generating a first control signal and a second control signal according to the first output signal and the second output signal, so as to adjust the tunable delay time of the first converting circuit, wherein the first output signal and the second output signal are coupled to the LVDS driving circuit.

In some embodiments, the first converting circuit includes a tunable inverter, and the second converting circuit includes a pair of fixed inverters.

In some embodiments, the tunable inverter includes: a first transistor, wherein the first transistor has a control terminal, a first terminal coupled to a supply voltage, and a second terminal; a second transistor, wherein the second transistor has a control terminal, a first terminal coupled to the second terminal of the first transistor, and a second terminal coupled to a first output node, wherein the first output node is arranged for outputting the first output signal; a third transistor, wherein the third transistor has a control terminal, a first terminal, and a second terminal coupled to the first output node; and a fourth transistor, wherein the fourth transistor has a control terminal, a first terminal coupled to a ground voltage, and a second terminal coupled to the first terminal of the third transistor, wherein the control terminal of one of the first transistor and the second transistor is coupled to the input signal, and the control terminal of the other one of the first transistor and the second transistor is coupled to the first output signal, wherein the control terminal of one of the third transistor and the fourth transistor is coupled to the input signal, and the control terminal of the other one of the third transistor and the fourth transistor is coupled to the second output signal.

In some embodiments, one of the pair of fixed inverters includes: a fifth transistor, wherein the fifth transistor has a control terminal, a first terminal coupled to a supply voltage, and a second terminal; a sixth transistor, wherein the sixth transistor has a control terminal, a first terminal coupled to the second terminal of the fifth transistor, and a second terminal; a seventh transistor, wherein the seventh transistor has a control terminal, a first terminal, and a second terminal coupled to the second terminal of the sixth transistor; and an eighth transistor, wherein the eighth transistor has a control terminal, a first terminal coupled to a ground voltage, and a second terminal coupled to the first terminal of the seventh transistor, wherein the control terminal of one of the fifth transistor and the sixth transistor is coupled to the input signal, and the control terminal of the other one of the fifth transistor and the sixth transistor is coupled to the ground voltage, wherein the control terminal of one of the seventh transistor and the eighth transistor is coupled to the input signal, and the control terminal of the other one of the seventh transistor and the eighth transistor is coupled to the supply voltage.

In some embodiments, another one of the pair of fixed inverters includes: a ninth transistor, wherein the ninth transistor has a control terminal, a first terminal coupled to the supply voltage, and a second terminal; a tenth transistor, wherein the tenth transistor has a control terminal, a first terminal coupled to the second terminal of the ninth transistor, and a second terminal coupled to a second output node, and wherein the second output node is arranged for outputting the second output signal; an eleventh transistor, wherein the eleventh transistor has a control terminal, a first terminal, and a second terminal coupled to the second output node; and a twelfth transistor, wherein the twelfth transistor has a control terminal, a first terminal coupled to the ground voltage, and a second terminal coupled to the first terminal of the eleventh transistor, wherein the control terminal of one of the ninth transistor and the tenth transistor is coupled to the second terminal of the sixth transistor, and the control terminal of the other one of the ninth transistor and the tenth transistor is coupled to the ground voltage, wherein the control terminal of one of the eleventh transistor and the twelfth transistor is coupled to the second terminal of the sixth transistor, and the control terminal of the other one of the eleventh transistor and the twelfth transistor is coupled to the supply voltage.

In some embodiments, the controller includes a first control circuit for generating the first control signal, and a second control circuit for generating the second control signal.

In some embodiments, the first control circuit includes: a NAND gate, wherein the NAND gate has a first input terminal for receiving the first output signal, a second input terminal for receiving the second output signal, and an output terminal coupled; a thirteenth transistor, wherein the thirteenth transistor has a control terminal coupled to the output terminal of the NAND gate, a first terminal coupled to a current source, and a second terminal coupled to a first control node, and wherein the first control node is arranged for outputting the first control signal; and a first capacitor, wherein the first capacitor has a first terminal coupled to the first control node, and a second terminal coupled to a ground voltage.

In some embodiments, the first control circuit further includes: a first switch, wherein the first switch has a first terminal coupled to the first control node, and a second terminal coupled to the ground voltage, and wherein the first switch is initially closed and then kept open so as to fine-tune a voltage level of the first control signal.

In some embodiments, the second control circuit includes: a NOR gate, wherein the NOR gate has a first input terminal for receiving the first output signal, a second input terminal for receiving the second output signal, and an output terminal; a fourteenth transistor, wherein the fourteenth transistor has a control terminal coupled to the output terminal of the NOR gate, a first terminal coupled to a current sink, and a second terminal coupled to a second control node, and wherein the second control node is arranged for outputting the second control signal; and a second capacitor, wherein the second capacitor has a first terminal coupled to the second control node, and a second terminal coupled to a ground voltage.

In some embodiments, the second control circuit further includes: a second switch, wherein the second switch has a first terminal coupled to the second control node, and a second terminal coupled to a supply voltage, and wherein the second switch is initially closed and then kept open so as to fine-tune a voltage level of the second control signal.

In some embodiments, the first converting circuit includes one tunable inverter and N pairs of fixed inverters, and the second converting circuit includes (N+1) pairs of fixed inverters, wherein N is a positive integer.

In some embodiments, the tunable inverter includes: a first transistor, wherein the first transistor has a control terminal, a first terminal coupled to a supply voltage, and a second terminal; a second transistor, wherein the second transistor has a control terminal, a first terminal coupled to the second terminal of the first transistor, and a second terminal coupled to a first output node, wherein the first output node is arranged for outputting the first output signal; a third transistor, wherein the third transistor has a control terminal, a first terminal, and a second terminal coupled to the first output node; and a fourth transistor, wherein the fourth transistor has a control terminal, a first terminal coupled to a ground voltage, and a second terminal coupled to the first terminal of the third transistor, wherein the control terminal of one of the first transistor and the second transistor is coupled to the input signal, and the control terminal of the other one of the first transistor and the second transistor is coupled to the first output signal, wherein the control terminal of one of the third transistor and the fourth transistor is coupled to the input signal, and the control terminal of the other one of the third transistor and the fourth transistor is coupled to the second output signal.

In some embodiments, for each of the pairs of fixed inverters, one of the pair of fixed inverters includes: a fifth transistor, wherein the fifth transistor has a control terminal, a first terminal coupled to a supply voltage, and a second terminal; a sixth transistor, wherein the sixth transistor has a control terminal, a first terminal coupled to the second terminal of the fifth transistor, and a second terminal; a seventh transistor, wherein the seventh transistor has a control terminal, a first terminal, and a second terminal coupled to the second terminal of the sixth transistor; and an eighth transistor, wherein the eighth transistor has a control terminal, a first terminal coupled to a ground voltage, and a second terminal coupled to the first terminal of the seventh transistor, wherein the control terminal of one of the fifth transistor and the sixth transistor is coupled to the input signal, and the control terminal of the other one of the fifth transistor and the sixth transistor is coupled to the ground voltage, wherein the control terminal of one of the seventh transistor and the eighth transistor is coupled to the input signal, and the control terminal of the other one of the seventh transistor and the eighth transistor is coupled to the supply voltage.

In some embodiments, for each of the pairs of fixed inverters, another one of the pair of fixed inverters includes: a ninth transistor, wherein the ninth transistor has a control terminal, a first terminal coupled to the supply voltage, and a second terminal; a tenth transistor, wherein the tenth transistor has a control terminal, a first terminal coupled to the second terminal of the ninth transistor, and a second terminal coupled to a second output node, and wherein the second output node is arranged for outputting the second output signal; an eleventh transistor, wherein the eleventh transistor has a control terminal, a first terminal, and a second terminal coupled to the second output node; and a twelfth transistor, wherein the twelfth transistor has a control terminal, a first terminal coupled to the ground voltage, and a second terminal coupled to the first terminal of the eleventh transistor, wherein the control terminal of one of the ninth transistor and the tenth transistor is coupled to the second terminal of the sixth transistor, and the control terminal of the other one of the ninth transistor and the tenth transistor is coupled to the ground voltage, wherein the control terminal of one of the eleventh transistor and the twelfth transistor is coupled to the second terminal of the sixth transistor, and the control terminal of the other one of the eleventh transistor and the twelfth transistor is coupled to the supply voltage.

In some embodiments, the LVDS driving circuit includes two output terminals and four transistors, wherein the two output terminals of the LVDS driving circuit are coupled to a supply voltage via two of the four transistors, respectively, and the two output terminals of the LVDS driving circuit are coupled to a ground voltage via the other two of the four transistors, respectively, and wherein two of the four transistors of the LVDS driving circuit are controlled by the first output signal, and the other two of the four transistors of the LVDS driving circuit are controlled by the second output signal.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

In order to illustrate the purposes, features and advantages of the invention, the embodiments and figures of the invention are described in detail as follows.

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". The term "substantially" means the value is within an acceptable error range. One skilled in the art can solve the technical problem within a predetermined error range and achieve the proposed technical performance. Also, the term "couple" is intended to mean either an indirect or direct electrical connection. Accordingly, if one device is coupled to another device, that connection may be through a direct electrical connection, or through an indirect electrical connection via other devices and connections.

Figure 1:
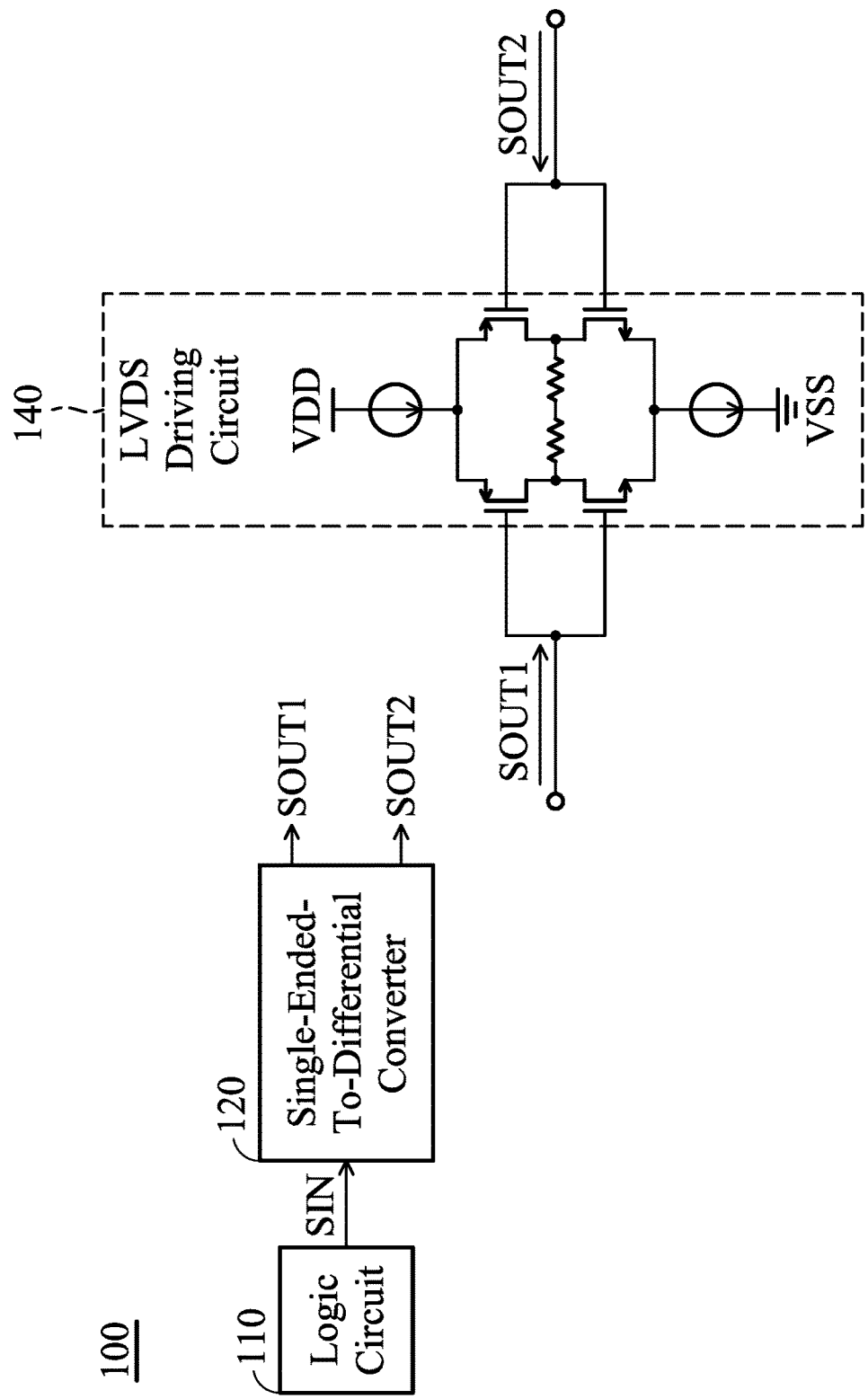
FIG. 1 is a diagram of a differential signaling system according to an embodiment of the invention.

FIG. 1 is a diagram of a differential signaling system 100 according to an embodiment of the invention. As shown in FIG. 1, the differential signaling system 100 includes a logic circuit 110, a single-ended-to-differential converter 120, and an LVDS (Low Voltage Differential Signaling) driving circuit 140. The logic circuit 110 is a single-ended digital circuit and is configured to generate an input signal SIN to drive the LVDS driving circuit 140. The single-ended-to-differential converter 120 is configured to convert the input signal SIN into a first output signal SOUT1 and a second output signal SOUT2. Ideally, the second output signal SOUT2 has the same logic level as that of the input signal SIN, and the first output signal SOUT1 has a complementary logic level of that of the input signal SIN. The first output signal SOUT1 and the second output signal SOUT2 are respectively used to control corresponding transistor switches of the LVDS driving circuit 140 to generate a differential output signal at output terminals of the LVDS driving circuit 140. In the embodiment of FIG. 1, the two output terminals of the LVDS driving circuit 140 are coupled to a supply voltage VDD via a current source and two PMOS transistors (P-type Metal Oxide Semiconductor Field Effect Transistors), respectively, and the two output terminals of the LVDS driving circuit 140 are coupled to a ground voltage VSS via a current sink and two NMOS transistors (N-type Metal Oxide Semiconductor Field Effect Transistors), respectively; the two transistors on the left are controlled by the first output signal SOUT1, and the two transistors on the right are controlled by the second output signal SOUT2. In another embodiment, the current source may be omitted; in another embodiment, the current sink may be omitted. In other embodiments, the four transistor switches may all be PMOS transistors or all be NMOS transistors, and those skilled in the art may couple the first output signal SOUT1 and the second output signal SOUT2 to different transistors according to their polarity. For instance, when all of the four transistors of the LVDS driving circuit 140 are NMOS transistors, the first output signal SOUT1 may control both the upper right transistor M1 and the lower left transistor, and the second output signal SOUT2 may control both the lower right transistor and the upper left transistor. In general, two of the four transistors of the LVDS driving circuit 140 may be controlled by the first output signal SOUT1, and the other two of the four transistors of the LVDS driving circuit 140 may be controlled by the second output signal SOUT2.

Figure 2:
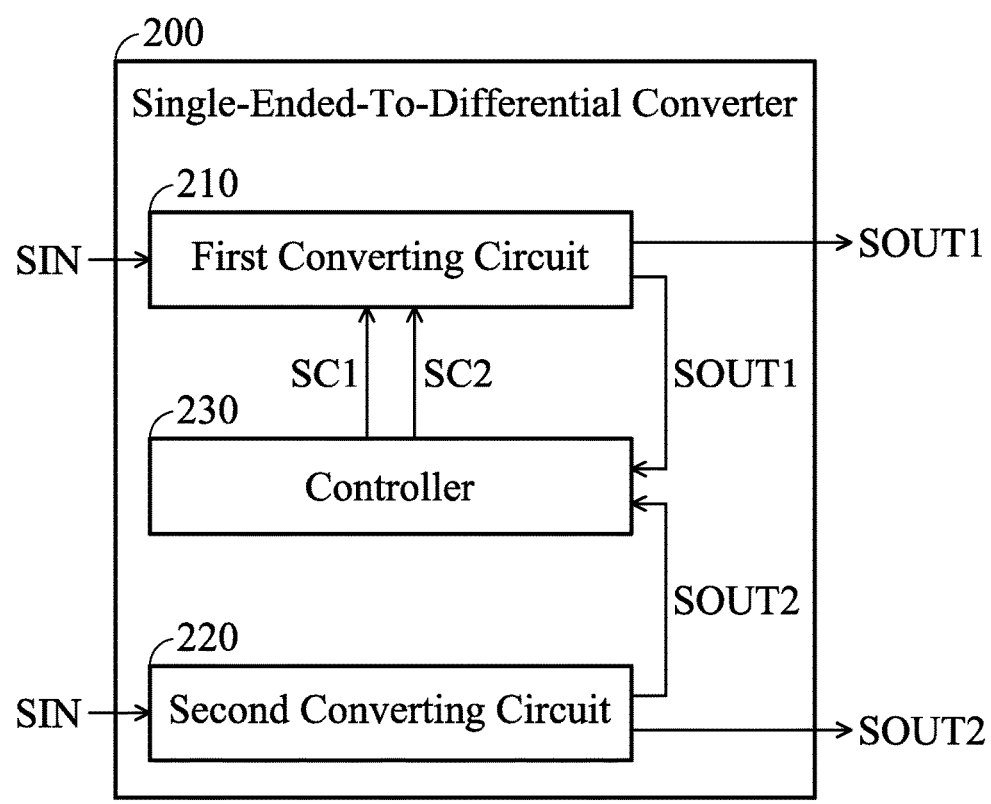
FIG. 2 is a diagram of a single-ended-to-differential converter for driving an LVDS (Low Voltage Differential Signaling) driving circuit according to an embodiment of the invention.

FIG. 2 is a diagram of a single-ended-to-differential converter 200 for driving an LVDS (Low Voltage Differential Signaling) driving circuit according to an embodiment of the invention. The single-ended-to-differential converter 200 may be applied as the single-ended-to-differential converter 120 in FIG. 1. As shown in FIG. 2, the single-ended-to-differential converter 200 includes a first converting circuit 210, a second converting circuit 220, and a controller 230. The first converting circuit 210 converts an input signal SIN into a first output signal SOUT1. The input signal SIN may be a digital logic signal. The first output signal SOUT1 may have a complementary logic level to that of the input signal SIN. The first converting circuit 210 has a tunable delay time between the input signal SIN and the first output signal SOUT1. The second converting circuit 220 converts the input signal SIN into a second output signal SOUT2. The second output signal SOUT2 may have the same logic level as that of the input signal SIN. The second converting circuit 220 has a fixed delay time between the input signal SIN and the second output signal SOUT2. The controller 230 generates a first control signal SC1 and a second control signal SC2 according to the first output signal SOUT1 and the second output signal SOUT2, so as to adjust the tunable delay time of the first converting circuit 210. In some embodiments, the first converting circuit 210 includes a tunable inverter, and the second converting circuit 220 includes a pair of fixed inverters forming a signal buffer. Because the aforementioned inverters have different delay times, the controller 230 is configured to synchronize the timing and phase of the first output signal SOUT1 and the second output signal SOUT2.

The structure and function of the single-ended-to-differential converter 200 will be introduced in the following figures and embodiments. It should be understood that these figures and embodiments are just exemplary, rather than restricted limitations of the inventions.

Figure 3A:
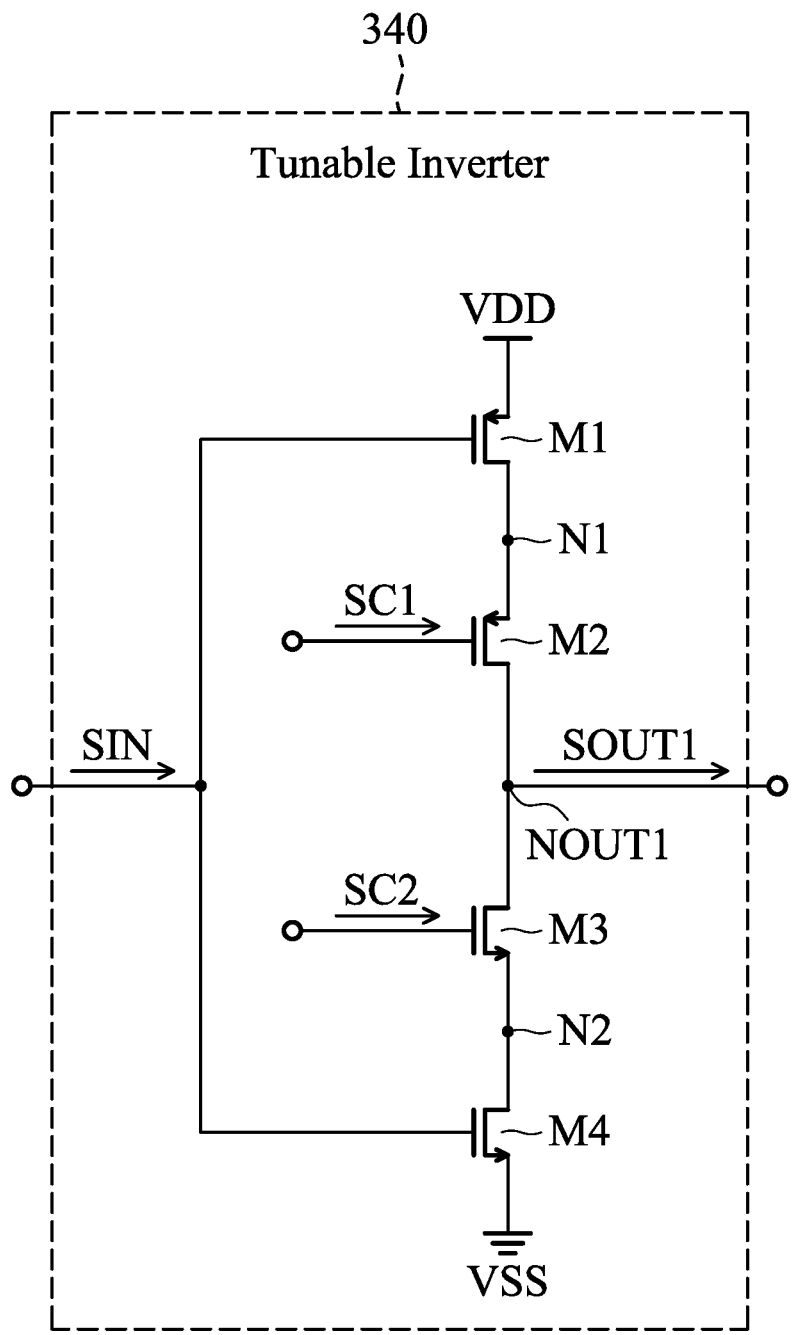
FIG. 3A is a diagram of a tunable inverter according to an embodiment of the invention.

FIG. 3A is a diagram of a tunable inverter 340 according to an embodiment of the invention. The tunable inverter 340 may be applied to the first converting circuit 210. In the embodiment of FIG. 3A, the tunable inverter 340 includes a first transistor M1, a second transistor M2, a third transistor M3, and a fourth transistor M4. The first transistor M1 and the second transistor M2 may be PMOS transistors (P-type Metal Oxide Semiconductor Field Effect Transistors). The third transistor M3 and the fourth transistor M4 may be NMOS transistors (N-type Metal Oxide Semiconductor Field Effect Transistors). The first transistor M1, the second transistor M2, the third transistor M3, and the fourth transistor M4 are coupled in series between a supply voltage VDD and a ground voltage VSS. The first transistor M1 has a control terminal for receiving the input signal SIN, a first terminal coupled to the supply voltage VDD, and a second terminal coupled to a first node N1. The second transistor M2 has a control terminal for receiving the first control signal SC1, a first terminal coupled to the first node N1, and a second terminal coupled to a first output node NOUT1.

The first output node NOUT1 is arranged for outputting the first output signal SOUT1. The third transistor M3 has a control terminal for receiving the second control signal SC2, a first terminal coupled to a second node N2, and a second terminal coupled to the first output node NOUT1. The fourth transistor M4 has a control terminal for receiving the input signal SIN, a first terminal coupled to the ground voltage VSS, and a second terminal coupled to the second node N2. In the embodiment of FIG. 3A, the resistances of the second transistor M2 and the third transistor M3 are adjustable according to the first control signal SC1 and the second control signal SC2, and therefore the total delay time of the tunable inverter 340 is tunable and determined by the controller 230.

Figure 3B:
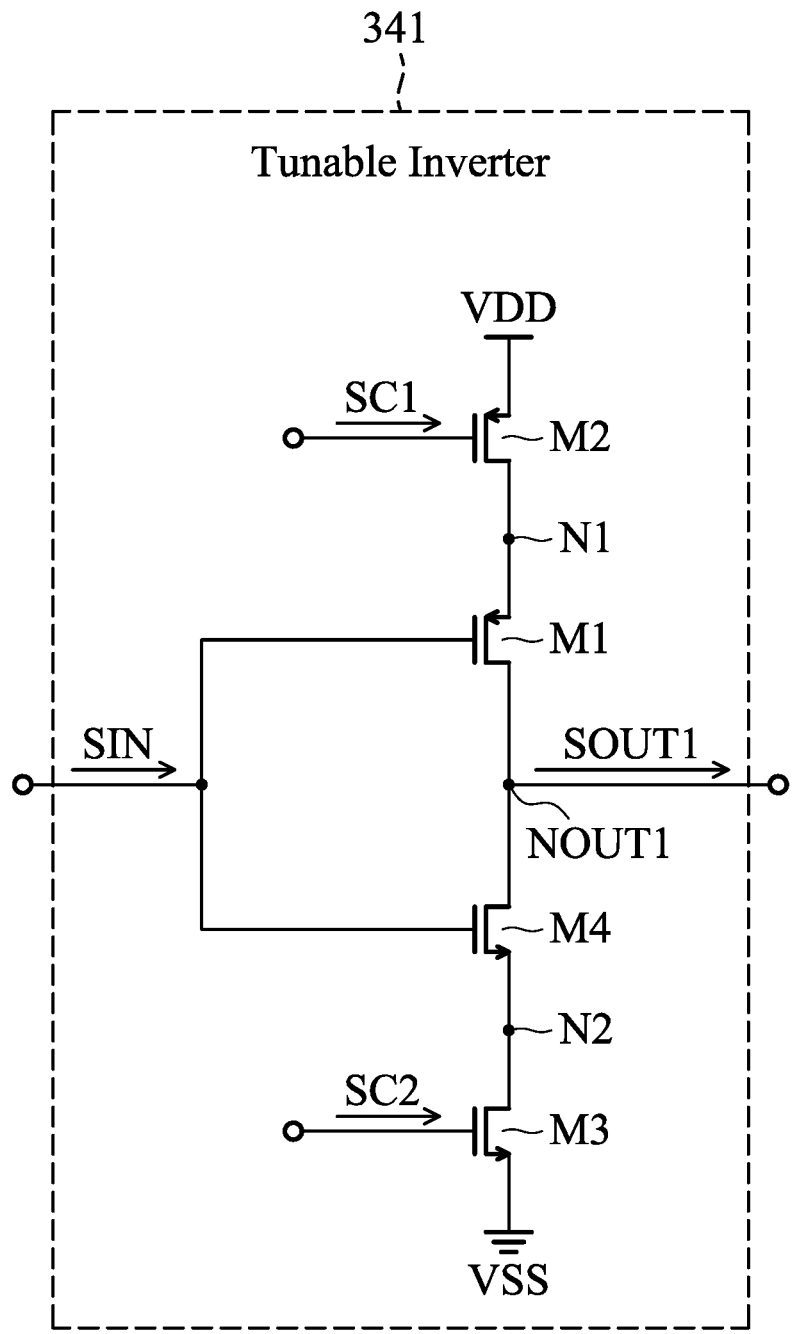
FIG. 3B is a diagram of a tunable inverter according to another embodiment of the invention.

FIG. 3B is a diagram of a tunable inverter 341 according to another embodiment of the invention. The tunable inverter 341 may be applied to the first converting circuit 210. In the embodiment of FIG. 3B, the tunable inverter 341 also includes a first transistor M1, a second transistor M2, a third transistor M3, and a fourth transistor M4. The second transistor M2 has a control terminal for receiving the first control signal SC1, a first terminal coupled to the supply voltage VDD, and a second terminal coupled to the first node N1. The first transistor M1 has a control terminal for receiving the input signal SIN, a first terminal coupled to the first node N1, and a second terminal coupled to the first output node NOUT1. The fourth transistor M4 has a control terminal for receiving the input signal SIN, a first terminal coupled to the second node N2, and a second terminal coupled to the first output node NOUT1. The third transistor M3 has a control terminal for receiving the second control signal SC2, a first terminal coupled to the ground voltage VSS, and a second terminal coupled to the second node N2. The element connection of the tunable inverter 341 is slightly different from that of FIG. 3A, but it does not affect the function of the tunable inverter 341. Other features of the tunable inverter 341 of FIG. 3B are similar to those of the tunable inverter 340 of FIG. 3A. Accordingly, the two embodiments can achieve similar levels of performance.

Figure 3C:
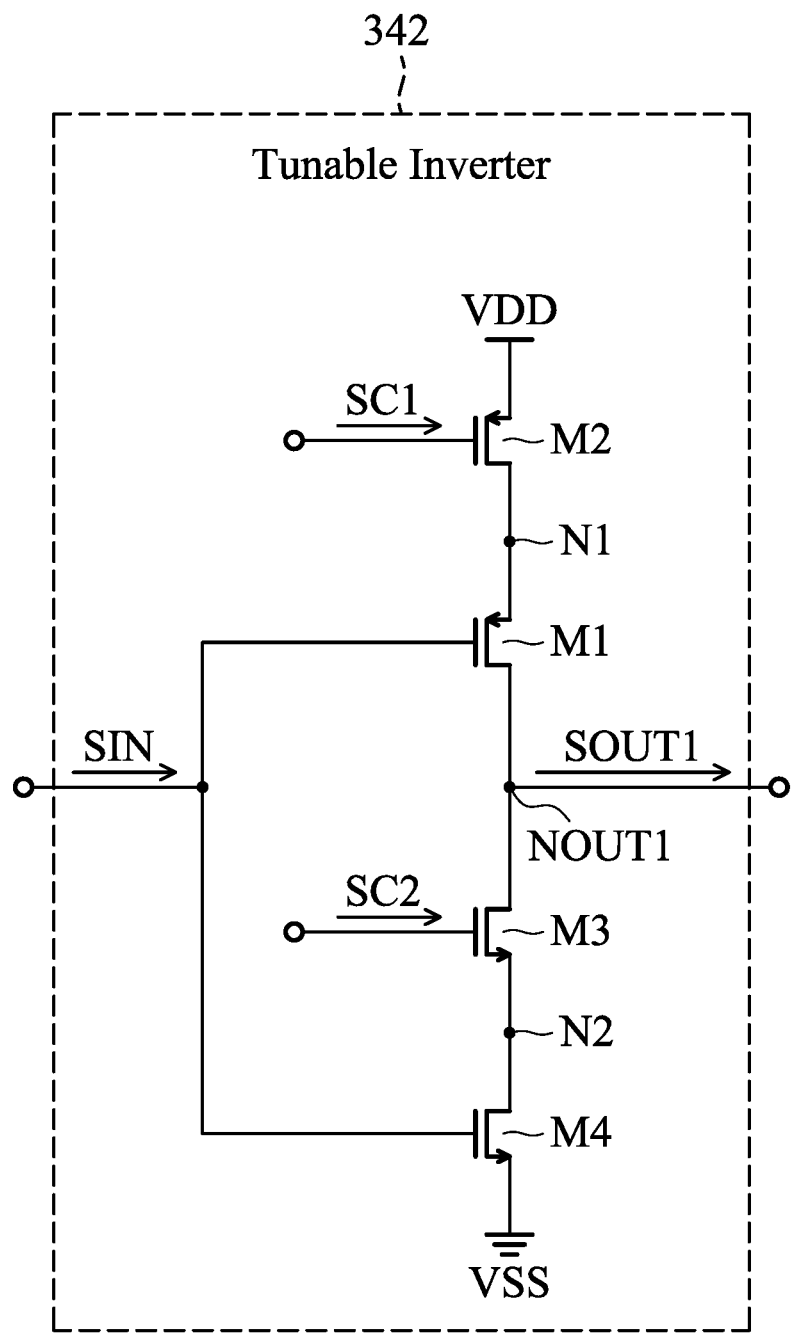
FIG. 3C is a diagram of a tunable inverter according to another embodiment of the invention.

FIG. 3C is a diagram of a tunable inverter 342 according to another embodiment of the invention. The tunable inverter 342 may be applied to the first converting circuit 210. In the embodiment of FIG. 3C, the tunable inverter 342 also includes a first transistor M1, a second transistor M2, a third transistor M3, and a fourth transistor M4. The second transistor M2 has a control terminal for receiving the first control signal SC1, a first terminal coupled to the supply voltage VDD, and a second terminal coupled to the first node N1. The first transistor M1 has a control terminal for receiving the input signal SIN, a first terminal coupled to the first node N1, and a second terminal coupled to the first output node NOUT1. The third transistor M3 has a control terminal for receiving the second control signal SC2, a first terminal coupled to the second node N2, and a second terminal coupled to the first output node NOUT1. The fourth transistor M4 has a control terminal for receiving the input signal SIN, a first terminal coupled to the ground voltage VSS, and a second terminal coupled to the second node N2. The element connection of the tunable inverter 342 is slightly different from that of FIG. 3A, but it does not affect the function of the tunable inverter 342. Other features of the tunable inverter 342 of FIG. 3C are similar to those of the tunable inverter 340 of FIG. 3A. Accordingly, the two embodiments can achieve similar levels of performance. In general, the control terminal of one of the two transistors coupled between the supply voltage VDD and the first output node NOUT1 may be coupled to the input signal SIN, while the control terminal of the other one of the two transistors coupled between the supply voltage VDD and the first output node NOUT1 may be coupled to the first control signal SC1; in general, the control terminal of one of the two transistors coupled between the ground voltage VSS and the first output node NOUT1 may be coupled to the input signal SIN, while the control terminal of the other one of the two transistors coupled between the ground voltage VSS and the first output node NOUT1 may be coupled to the second control signal SC2.

Figure 4:
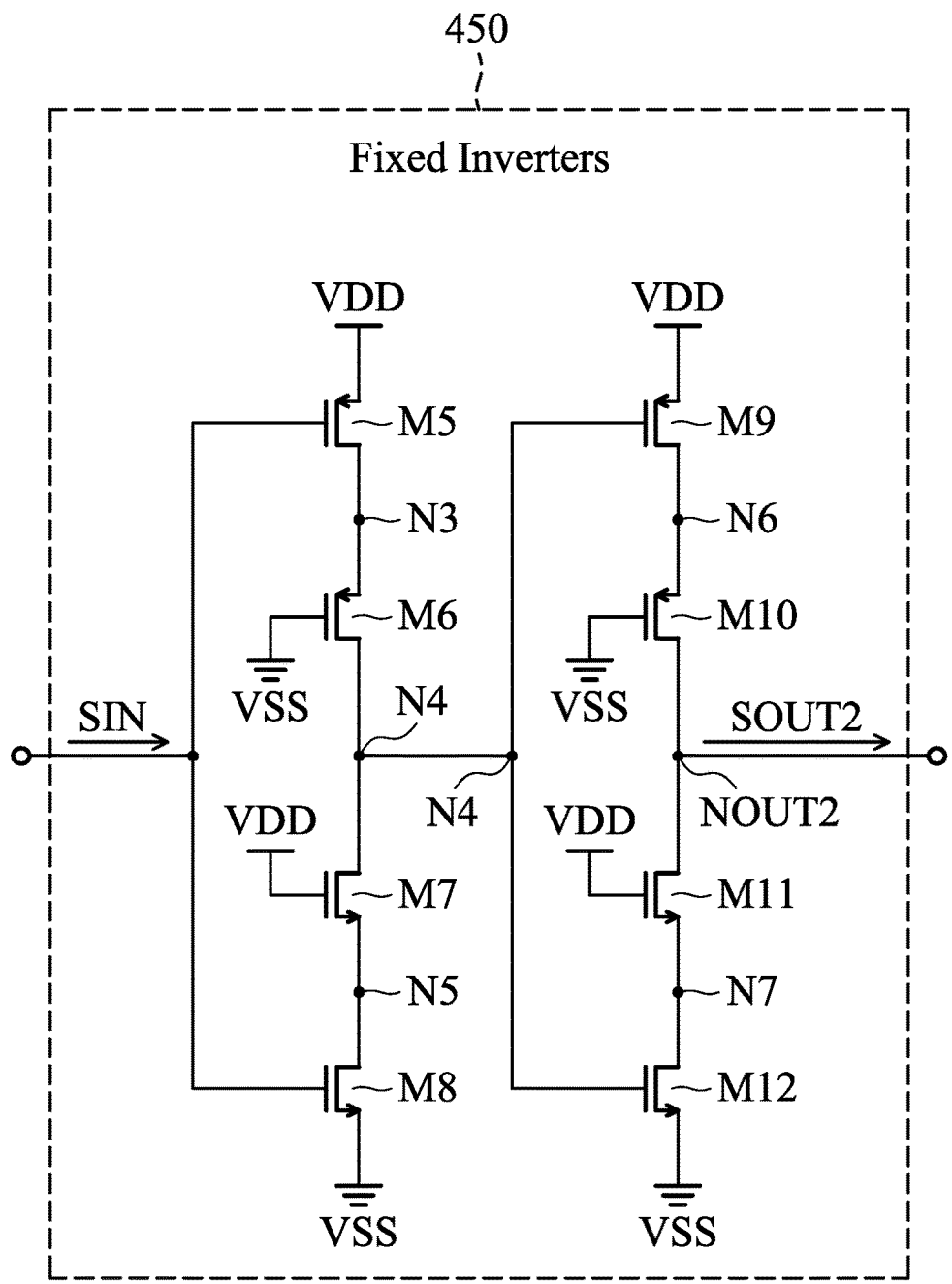
FIG. 4 is a diagram of a pair of fixed inverters according to an embodiment of the invention.

FIG. 4 is a diagram of a pair of fixed inverters 450 according to an embodiment of the invention. The pair of the fixed inverters 450 may be applied to the second converting circuit 220. In the embodiment of FIG. 4, one of the fixed inverters 450 includes a fifth transistor M5, a sixth transistor M6, a seventh transistor M7, and an eighth transistor M8; and another one of the fixed inverters 450 includes a ninth transistor M9, a tenth transistor M10, an eleventh transistor M11, and a twelfth transistor M12. The fifth transistor M5, the sixth transistor M6, the ninth transistor M9, and the tenth transistor M10 may be PMOS transistors (P-type Metal Oxide Semiconductor Field Effect Transistors). The seventh transistor M7, the eighth transistor M8, the eleventh transistor M11, and the twelfth transistor M12 may be NMOS transistors (N-type Metal Oxide Semiconductor Field Effect Transistors). The fifth transistor M5 has a control terminal for receiving the input signal SIN, a first terminal coupled to the supply voltage VDD, and a second terminal coupled to a third node N3. The sixth transistor M6 has a control terminal coupled to the ground voltage VSS, a first terminal coupled to the third node N3, and a second terminal coupled to a fourth node N4. The seventh transistor M7 has a control terminal coupled to the supply voltage VDD, a first terminal coupled to a fifth node N5, and a second terminal coupled to the fourth node N4. The eighth transistor M8 has a control terminal for receiving the input signal SIN, a first terminal coupled to the ground voltage VSS, and a second terminal coupled to the fifth node N5. The ninth transistor M9 has a control terminal coupled to the fourth node N4, a first terminal coupled to the supply voltage VDD, and a second terminal coupled to a sixth node N6. The tenth transistor M10 has a control terminal coupled to the ground voltage VSS, a first terminal coupled to the sixth node N6, and a second terminal coupled to a second output node NOUT2. The second output node NOUT2 is arranged for outputting the second output signal SOUT2. The eleventh transistor M11 has a control terminal coupled to the supply voltage VDD, a first terminal coupled to a seventh node N7, and a second terminal coupled to the second output node NOUT2. The twelfth transistor M12 has a control terminal coupled to the fourth node N4, a first terminal coupled to the ground voltage VSS, and a second terminal coupled to the seventh node N7. In the embodiment of FIG. 4, the resistances of the sixth transistor M6, the seventh transistor M7, the tenth transistor M10, and the eleventh transistor M11 are unchangeable, and therefore the total delay time of the pair of fixed inverters 450 is a constant value. Since the first output signal SOUT1 is generated with one inverter but the second output signal SOUT2 is generated with two cascading inverters, the second output signal SOUT2 has the same logic level as that of the input signal SIN, and the first output signal SOUT1 has a complementary logic level of that of the input signal SIN. The pair of the fixed inverters 450 in the embodiment of FIG. 4 has a configuration corresponding to that of the tunable inverter 340 in the embodiment of FIG. 3A (i.e., with input signals coupled to control terminals of both the topmost and bottommost transistors); in other embodiments, the pair of the fixed inverters 450 may have other configurations, such as those corresponding to the tunable inverter 341 in the embodiment of FIG. 3B or the tunable inverter 342 in the embodiment of FIG. 3C (i.e., with input signals coupled to control terminals of transistors other than both the topmost and bottommost).

Ideally, the first output signal SOUT1 and the second output signal SOUT2 should have different logic levels but the same signal timing and phase. However, since the first output signal SOUT1 is generated with one inverter but the second output signal SOUT2 is generated with two cascading inverters, it is difficult to for them to have the same delay time and signal timing. In order to solve the problem, the controller 230 is arranged for synchronizing the timing and phase of the first output signal SOUT1 and the second output signal SOUT2. In some embodiments, the controller 230 includes a first control circuit 560 for generating the first control signal SC1, and a second control circuit 570 for generating the second control signal SC2. The total delay time of the first converting circuit 210 is adjustable in response to the first control signal SC1 and the second control signal SC2, and therefore it can be consistent with the total delay time of the second converting circuit 220. The detailed structures and functions of the first control circuit 560 and the second control circuit 570 will be described in the following embodiments.

Figure 5A:
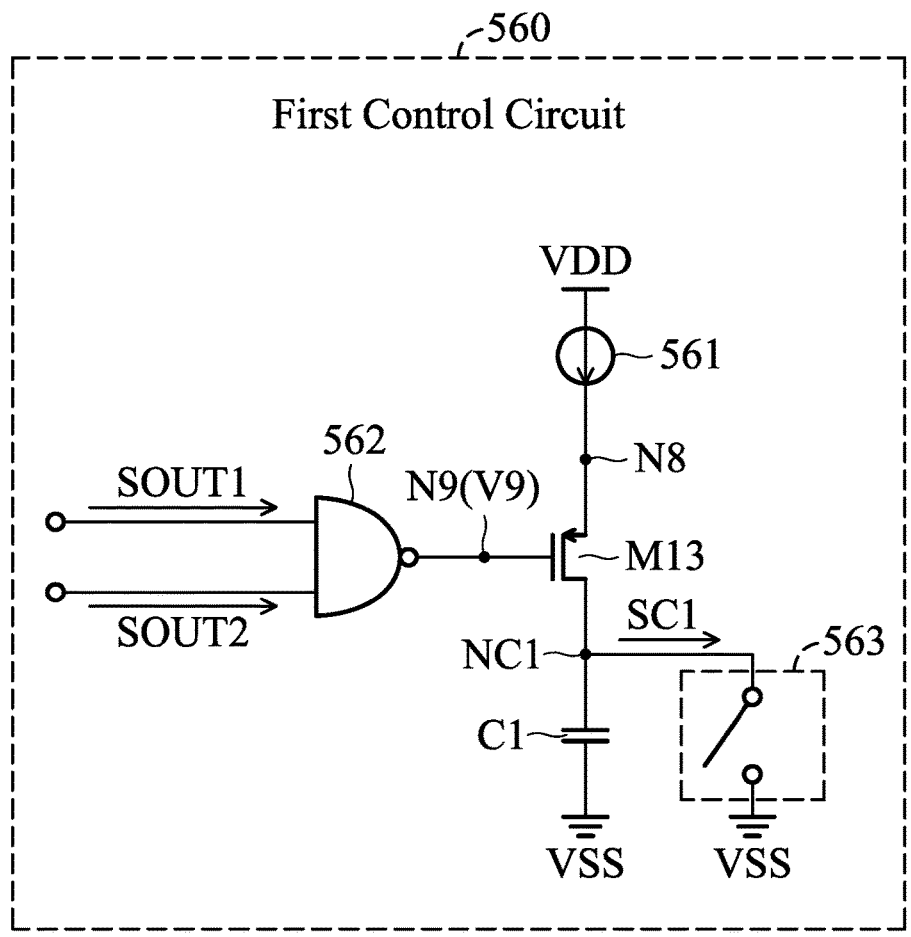
FIG. 5A is a diagram of a first control circuit according to an embodiment of the invention.

FIG. 5A is a diagram of the first control circuit 560 according to an embodiment of the invention. In the embodiment of FIG. 5A, the first control circuit 560 includes a current source 561, an NAND gate 562, a thirteenth transistor M13, and a first capacitor C1. The current source 561 supplies a first current to an eighth node N8. The NAND gate 562 has a first input terminal for receiving the first output signal SOUT1, a second input terminal for receiving the second output signal SOUT2, and an output terminal coupled to a ninth node N9. The thirteenth transistor M13 may be a PMOS transistor (P-type Metal Oxide Semiconductor Field Effect Transistor). The thirteenth transistor M13 has a control terminal coupled to the ninth node N9, a first terminal coupled to the eighth node N8, and a second terminal coupled to a first control node NC1. The first control node NC1 is arranged for outputting the first control signal SC1 to control the corresponding second transistor M2 of the tunable inverter 340 (or 341 or 342). The first capacitor C1 has a first terminal coupled to the first control node NC1, and a second terminal coupled to the ground voltage VSS. In some embodiments, the first control circuit 560 further includes a first switch 563. The first switch 563 has a first terminal coupled to the first control node NC1, and a second terminal coupled to the ground voltage VSS. The first switch 563 is initially closed (i.e., conducting) and then kept open (i.e., not conducting) so as to fine-tune the voltage level of the first control signal SC1.

Figure 5B:
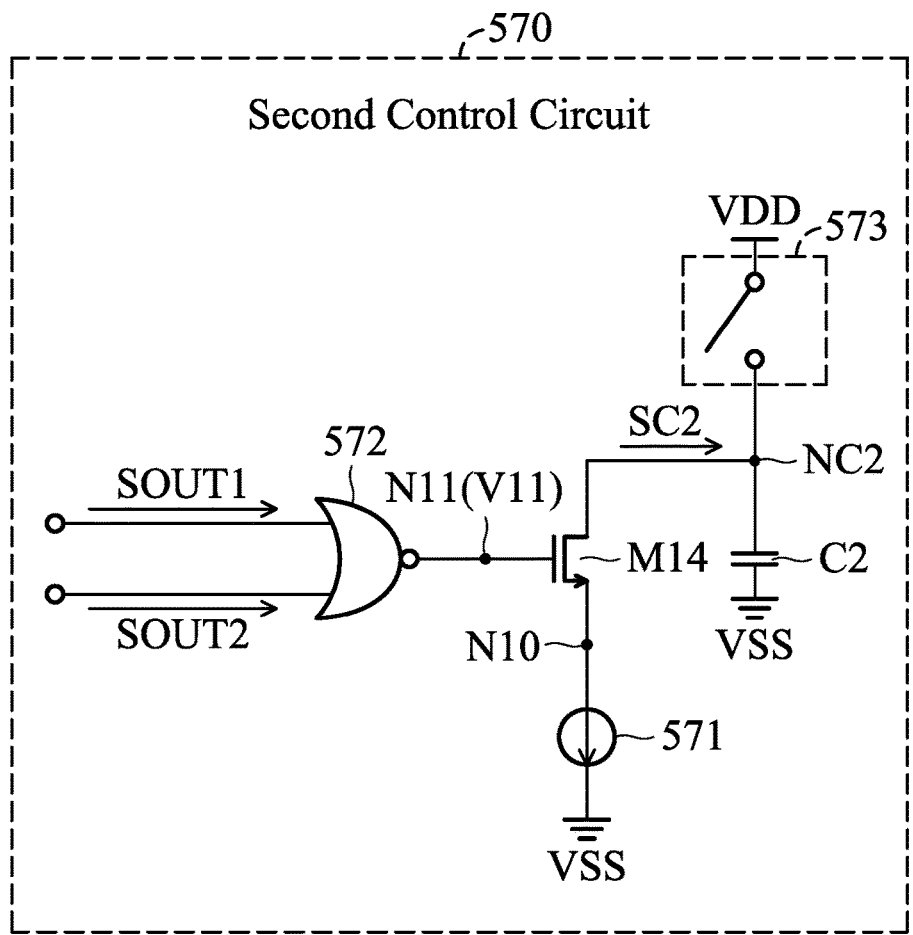
FIG. 5B is a diagram of a second control circuit according to an embodiment of the invention.

FIG. 5B is a diagram of the second control circuit 570 according to an embodiment of the invention. In the embodiment of FIG. 5B, the second control circuit 570 includes a current sink 571, an NOR gate 572, a fourteenth transistor M14, and a second capacitor C2. The current sink 571 draws a second current from a tenth node N10. The NOR gate 572 has a first input terminal for receiving the first output signal SOUT1, a second input terminal for receiving the second output signal SOUT2, and an output terminal coupled to an eleventh node N11. The fourteenth transistor M14 may be an NMOS transistor (N-type Metal Oxide Semiconductor Field Effect Transistor). The fourteenth transistor M14 has a control terminal coupled to the eleventh node N11, a first terminal coupled to the tenth node N10, and a second terminal coupled to a second control node NC2. The second control node NC2 is arranged for outputting the second control signal SC2 to control the corresponding second transistor M3 of the tunable inverter 340 (or 341 or 342). The second capacitor C2 has a first terminal coupled to the second control node NC2, and a second terminal coupled to the ground voltage VSS. In some embodiments, the second control circuit 570 further includes a second switch 573. The second switch 573 has a first terminal coupled to the second control node NC2, and a second terminal coupled to the supply voltage VDD. The second switch 573 is initially closed (i.e., conducting) and then kept open (i.e., not conducting) so as to fine-tune the voltage level of the second control signal SC2.

Figure 6:
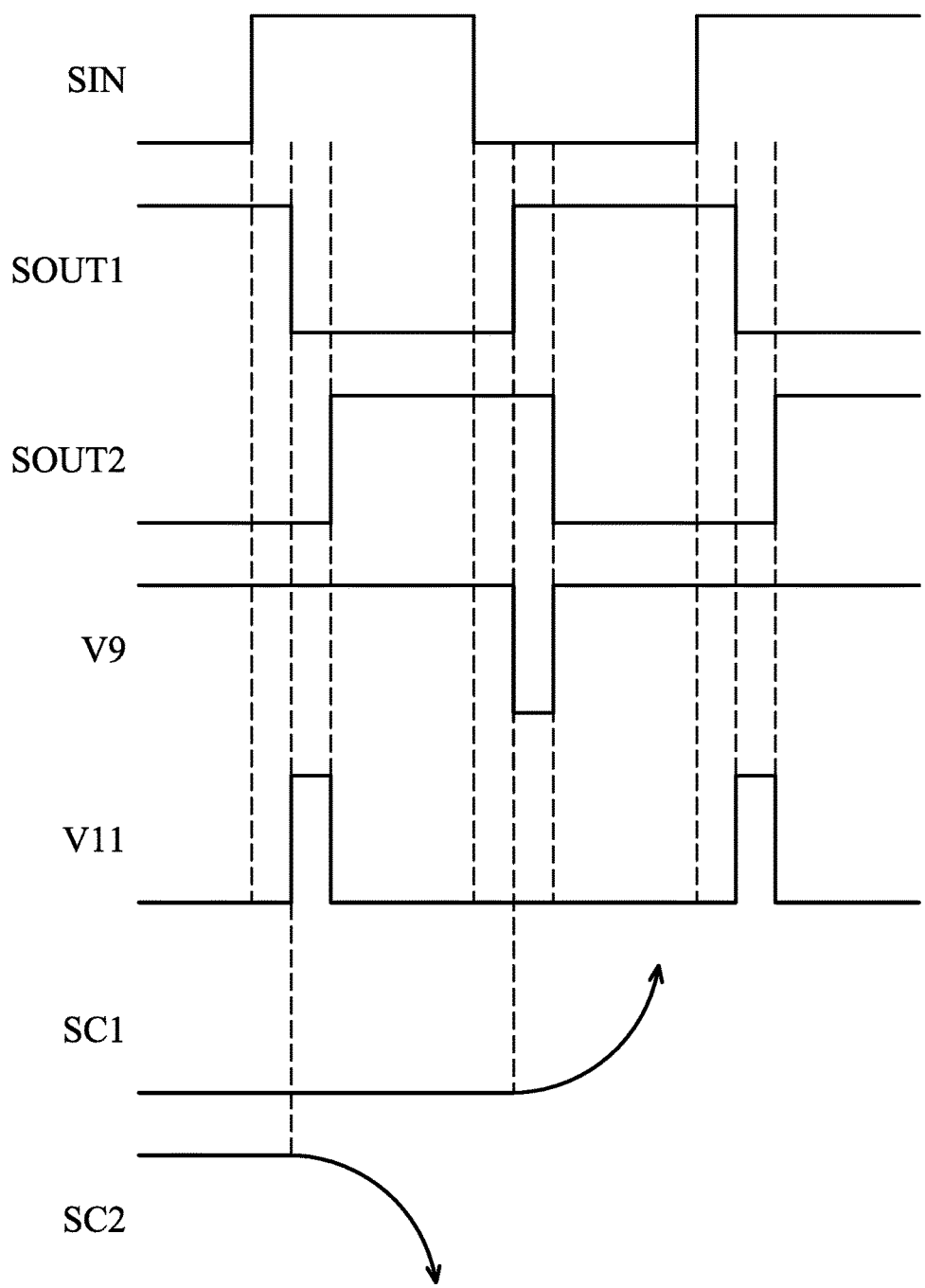
FIG. 6 is a diagram of signal waveforms of a single-ended-to-differential converter according to an embodiment of the invention.

FIG. 6 is a diagram of signal waveforms of the single-ended-to-differential converter 200 according to an embodiment of the invention. The horizontal axis represents time, and the vertical axis represents voltage. Please refer to FIGS. 2 to 6 together. Initially, the first switch 563 and the second switch 573 are both temporarily closed, such that the voltage level of the first control signal SC1 is forced to be the ground voltage VSS, and the voltage level of the second control signal SC2 is forced to be the supply voltage VDD. At this time, the tunable delay time of the first converting circuit 210 is initially minimized because the second transistor M2 and the third transistor M3 have the lowest resistance. Next, the first switch 563 and the second switch 573 are both opened and kept open, and the first control circuit 560 and the second control circuit 570 of the controller 230 start to optimize the tunable delay time of the first converting circuit 210.

In the beginning of the tuning process, the phase of the first output signal SOUT1 is leading that of the second output signal SOUT2 because the first converting circuit 210 has a shorter delay time than the second converting circuit 220 does. The NAND gate 562 of the first control circuit 560 is used to monitor the phase difference between the first output signal SOUT1 and the second output signal SOUT2. Every time the first output signal SOUT1 and the second output signal SOUT2 both have high logic levels, the NAND gate 562 temporarily pulls down the voltage V9 at the ninth node N9 and turns on the thirteenth transistor M13, such that the current source 561 supplies the first current to the first control node NC1 to charge the first capacitor C1 and pulls up the voltage level of the first control signal SC1. Accordingly, the first control signal SC1 gradually rises from the ground voltage VSS, and the resistance of the second transistor M2 gradually becomes higher. Similarly, the NOR gate 572 of the second control circuit 570 is used to monitor the phase difference between the first output signal SOUT1 and the second output signal SOUT2. Every time the first output signal SOUT1 and the second output signal SOUT2 both have low logic levels, the NOR gate 572 temporarily pulls up the voltage V11 at the eleventh node N11 and turns on the fourteenth transistor M14, such that the current sink 571 draws the second current from the second control node NC2 to discharge the second capacitor C2 and pulls down the voltage level of the second control signal SC2. Accordingly, the second control signal SC2 gradually falls from the supply voltage VDD, and the resistance of the third transistor M3 gradually becomes higher. As the resistances of the second transistor M2 and the third transistor M3 gradually become higher, the tunable delay time of the first converting circuit 210 gradually increases. Finally, when the tuning process is completed, the first control signal SC1 and the second control signal SC2 are optimized and maintained at the appropriate voltage levels (e.g., some voltage levels between the supply voltage VDD and the ground voltage VSS), and the tunable delay time of the first converting circuit 210 becomes almost identical to the fixed delay time of the second converting circuit 220. At this time, the phase difference between the first output signal SOUT1 and the second output signal SOUT2 is reduced almost to zero.

Figure 7:
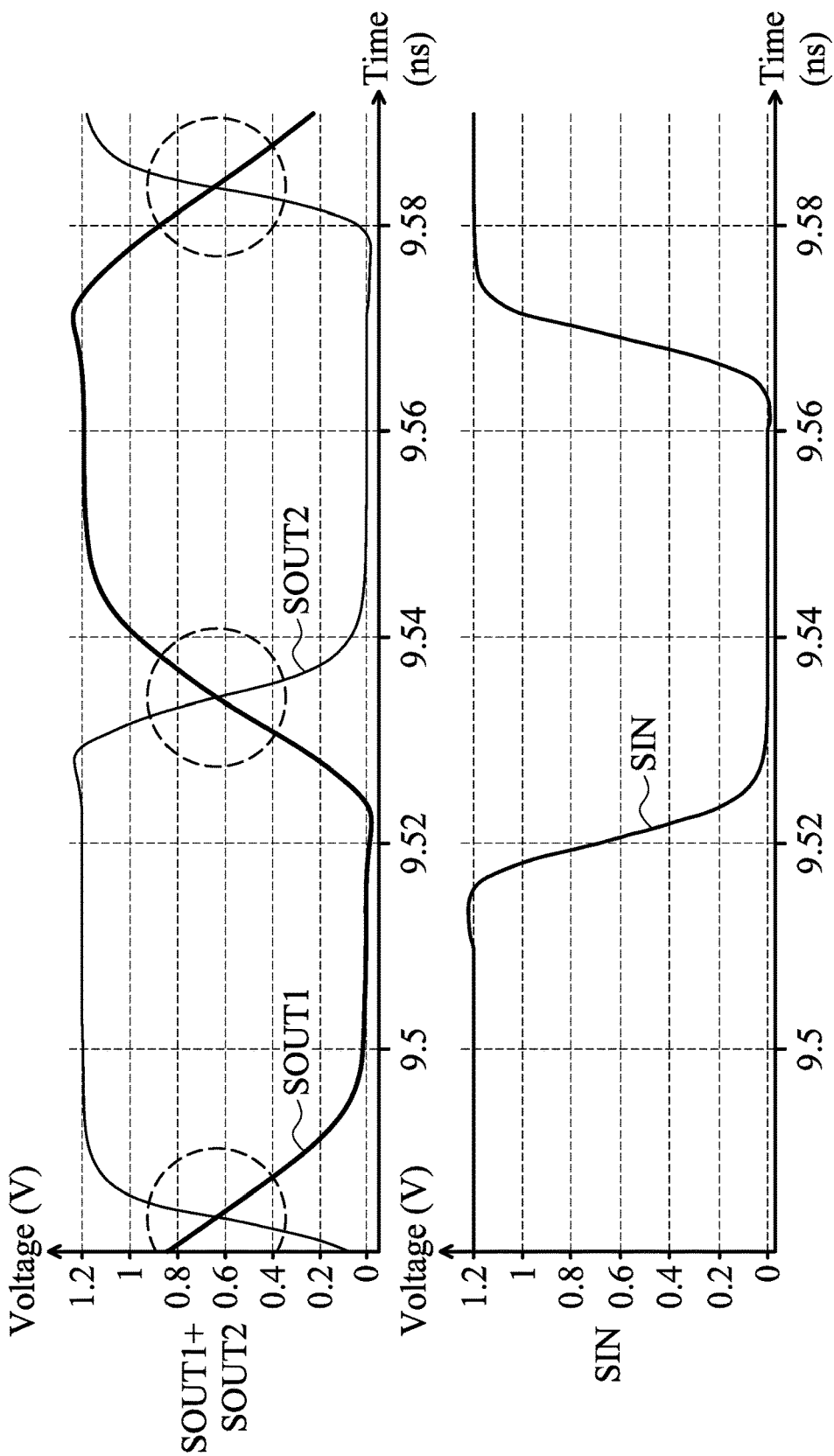
FIG. 7 is a diagram of signal waveforms of a single-ended-to-differential converter according to an embodiment of the invention.

FIG. 7 is a diagram of signal waveforms of the single-ended-to-differential converter 200 according to an embodiment of the invention. The horizontal axis represents time, and the vertical axis represents voltage. FIG. 7 shows the waveforms of the first output signal SOUT1 and the second output signal SOUT2 when the tunable delay time of the first converting circuit 210 has been fine-tuned and optimized. According to the measurement of FIG. 7, with the proposed design, the cross-over point between the first output signal SOUT1 and the second output signal SOUT2 is around 0.6V, which is an average value of the supply voltage VDD (e.g., 1.2V) and the ground voltage VSS (e.g., 0V). That is, the phase difference between the first output signal SOUT1 and the second output signal SOUT2 is almost eliminated by the controller 230, and the first output signal SOUT1 and the second output signal SOUT2 finally have the same signal timing and phase.

Figure 8:
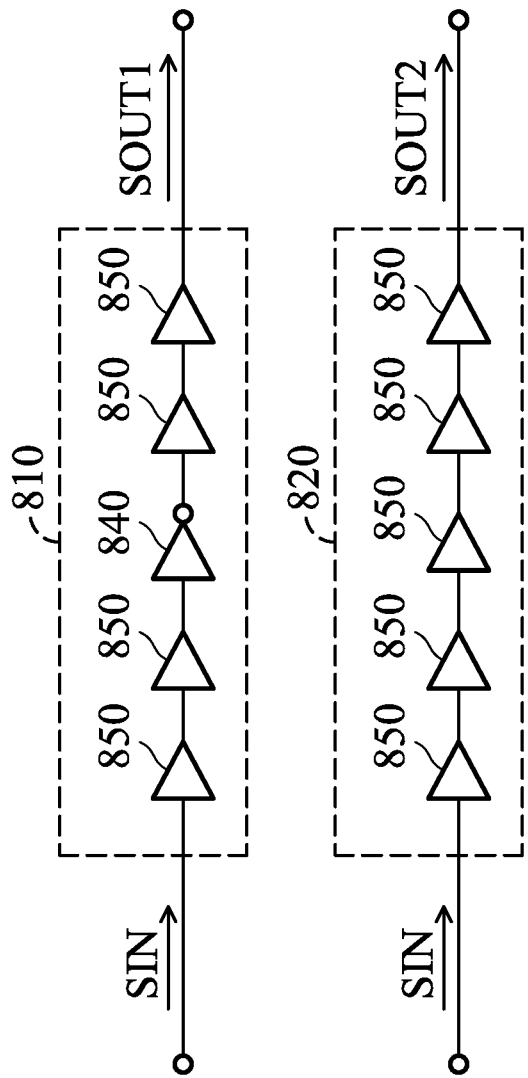
FIG. 8 is a diagram of a first converting circuit and a second converting circuit according to another embodiment of the invention.

FIG. 8 is a diagram of a first converting circuit 810 and a second converting circuit 820 according to another embodiment of the invention. The first converting circuit 810 and the second converting circuit 820 may be applied to the single-ended-to-differential converter 200 of FIG. 2. In the embodiment of FIG. 8, the first converting circuit 810 includes one tunable inverter 840 and N pairs of fixed inverters 850, and the second converting circuit 820 includes (N+1) pairs of fixed inverters 850. The aforementioned N is a positive integer, and FIG. 8 shows an example of N equal to 4, but the invention is not limited to the above. For example, the structure of the tunable inverter 840 may be the same as that of the tunable inverter 340, 341, or 342 of FIG. 3A, FIG. 3B, or FIG. 3C; and the structure of the pair of fixed inverters 850 may be the same as that of the pair of fixed inverters 450 of FIG. 4 or other corresponding configurations as described in above. The tunable delay time of the first converting circuit 810 can be adjusted using the controller 230, as mentioned above. In the embodiment of FIG. 8, more pairs of fixed inverters 850 are added into the first converting circuit 810 and the second converting circuit 820. These added fixed inverters 850 are configured to make the transition slope of the first output signal SOUT1 equal to the transition slope of the second output signal SOUT2. The aforementioned transition slope refers to the slope of output signal at its rising/falling edge. Generally, the transition slope of the second output signal SOUT2 is two times the transition slope of the first output signal SOUT1 because the second output signal SOUT2 is generated by two cascading inverters which have stronger driving capability, while the first output signal SOUT1 is generated by a single inverter. The two cascading inverters cause the transition slope of the output signal to be sharper than that of the single inverter. In order to eliminate this slope mismatch, more pairs of fixed inverters 850 are used for reducing the difference in driving capability between the first converting circuit 810 and the second converting circuit 820.

Figure 9:
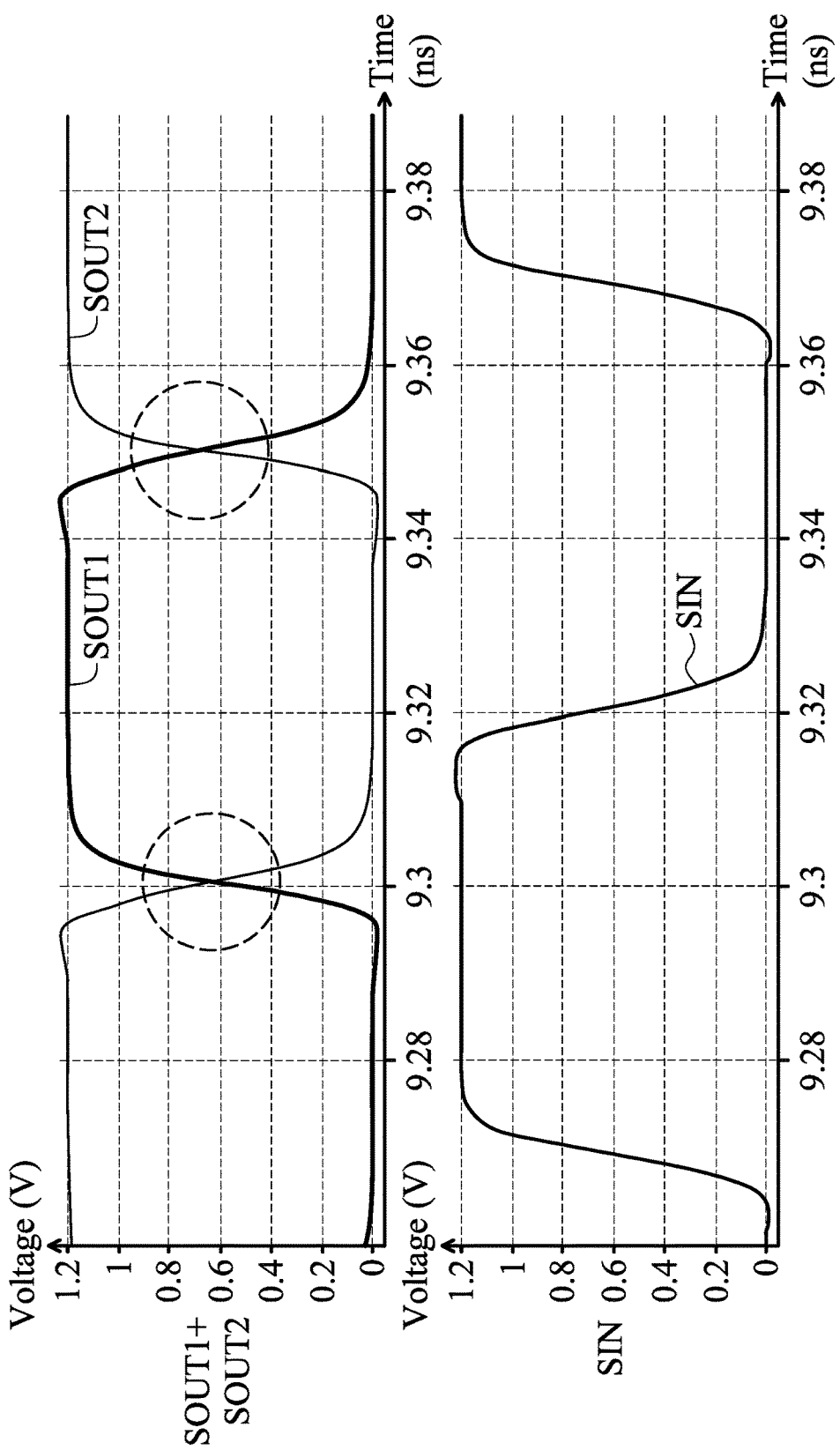
FIG. 9 is a diagram of signal waveforms of a single-ended-to-differential converter including a first converting circuit and a second converting circuit according to an embodiment of the invention.

FIG. 9 is a diagram of signal waveforms of the single-ended-to-differential converter 200 including the first converting circuit 810 and the second converting circuit 820 of FIG. 8 according to an embodiment of the invention. The horizontal axis represents time, and the vertical axis represents voltage. FIG. 9 shows the waveforms of the first output signal SOUT1 and the second output signal SOUT2 when the tunable delay time of the first converting circuit 810 has been fine-tuned and optimized. According to the simulation of FIG. 9, with the proposed design, the transition slope of the first output signal SOUT1 is almost the same as the that of the second output signal SOUT2, and the cross-over point between the first output signal SOUT1 and the second output signal SOUT2 is still around at the average value of the supply voltage VDD and the ground voltage VSS. Accordingly, the embodiment of FIG. 8 solves the problems of both the crossover-point mismatch and the transition-slope mismatch of the output signal in the single-ended-to-differential converter 200.

The invention provides a novel single-ended-to-differential converter for driving an LVDS driving circuit. In conclusion, the proposed design has at least the following advantages over the prior art: (1) arranging the cross-over point between positive and negative output signals at their median voltage; (2) equalizing the transition slopes of the positive and negative output signals; (3) eliminating the output jitter of the LVDS driving circuit; and (4) being more insensitive to PVT (Process, Voltage, and Temperature) variations.

Note that the above voltages, currents, resistances, inductances, capacitances and other element parameters are not limitations of the invention. A designer can adjust these parameters according to different requirements. The single-ended-to-differential converter and LVDS driving circuit of the invention are not limited to the configurations of FIGS. 1-9. The invention may merely include any one or more features of any one or more embodiments of FIGS. 1-9. In other words, not all of the features displayed in the figures should be implemented in the single-ended-to-differential converter and LVDS driving circuit of the invention.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

It will be apparent to those skilled in the art that various modifications and variations can be made in the invention. It is intended that the standard and examples be considered exemplary only, with a true scope of the disclosed embodiments being indicated by the following claims and their equivalents.

What is claimed is:

1. A single-ended-to-differential converter for driving an LVDS (Low Voltage Differential Signaling) driving circuit according to an input signal, comprising:
  a first converting circuit, converting the input signal into a first output signal, wherein the first converting circuit has a tunable delay time;
  a second converting circuit, converting the input signal into a second output signal, wherein the second converting circuit has a fixed delay time; and
  a controller, generating a first control signal and a second control signal according to the first output signal and the second output signal, so as to adjust the tunable delay time of the first converting circuit,
  wherein the first output signal and the second output signal are coupled to the LVDS driving circuit;
  wherein the controller comprises a first control circuit for generating the first control signal, and a second control circuit for generating the second control signal;

wherein the first control circuit comprises:
a NAND gate, wherein the NAND gate has a first input terminal for receiving the first output signal, a second input terminal for receiving the second output signal, and an output terminal:
a thirteenth transistor, wherein the thirteenth transistor has a control terminal coupled to the output terminal of the NAND gate, a first terminal coupled to a current source, and a second terminal coupled to a first control node, and wherein the first control node is arranged for outputting the first control signal; and
a first capacitor, wherein the first capacitor has a first terminal coupled to the first control node, and a second terminal coupled to a ground voltage.

2. The single-ended-to-differential converter as claimed in claim 1, wherein the first converting circuit comprises a tunable inverter, and the second converting circuit comprises a pair of fixed inverters.

3. The single-ended-to-differential converter as claimed in claim 2, wherein the tunable inverter comprises:
a first transistor, wherein the first transistor has a control terminal, a first terminal coupled to a supply voltage, and a second terminal;
a second transistor, wherein the second transistor has a control terminal, a first terminal coupled to the second terminal of the first transistor, and a second terminal coupled to a first output node, wherein the first output node is arranged for outputting the first output signal;
a third transistor, wherein the third transistor has a control terminal, a first terminal, and a second terminal coupled to the first output node; and
a fourth transistor, wherein the fourth transistor has a control terminal, a first terminal coupled to a ground voltage, and a second terminal coupled to the first terminal of the third transistor,
wherein the control terminal of one of the first transistor and the second transistor is coupled to the input signal, and the control terminal of the other one of the first transistor and the second transistor is coupled to the first control signal,
wherein the control terminal of one of the third transistor and the fourth transistor is coupled to the input signal, and the control terminal of the other one of the third transistor and the fourth transistor is coupled to the second control signal.

4. The single-ended-to-differential converter as claimed in claim 2, wherein one of the pair of fixed inverters comprises:
a fifth transistor, wherein the fifth transistor has a control terminal, a first terminal coupled to a supply voltage, and a second terminal;
a sixth transistor, wherein the sixth transistor has a control terminal, a first terminal coupled to the second terminal of the fifth transistor, and a second terminal;
a seventh transistor, wherein the seventh transistor has a control terminal, a first terminal, and a second terminal coupled to the second terminal of the sixth transistor; and
an eighth transistor, wherein the eighth transistor has a control terminal, a first terminal coupled to a ground voltage, and a second terminal coupled to the first terminal of the seventh transistor,
wherein the control terminal of one of the fifth transistor and the sixth transistor is coupled to the input signal, and the control terminal of the other one of the fifth transistor and the sixth transistor is coupled to the ground voltage,
wherein the control terminal of one of the seventh transistor and the eighth transistor is coupled to the input signal, and the control terminal of the other one of the seventh transistor and the eighth transistor is coupled to the supply voltage.

5. The single-ended-to-differential converter as claimed in claim 4, wherein another one of the pair of fixed inverters comprises:
a ninth transistor, wherein the ninth transistor has a control terminal, a first terminal coupled to the supply voltage, and a second terminal;
a tenth transistor, wherein the tenth transistor has a control terminal, a first terminal coupled to the second terminal of the ninth transistor, and a second terminal coupled to a second output node, and wherein the second output node is arranged for outputting the second output signal;
an eleventh transistor, wherein the eleventh transistor has a control terminal, a first terminal, and a second terminal coupled to the second output node; and
a twelfth transistor, wherein the twelfth transistor has a control terminal, a first terminal coupled to the ground voltage, and a second terminal coupled to the first terminal of the eleventh transistor,
wherein the control terminal of one of the ninth transistor and the tenth transistor is coupled to the second terminal of the sixth transistor, and the control terminal of the other one of the ninth transistor and the tenth transistor is coupled to the ground voltage,
wherein the control terminal of one of the eleventh transistor and the twelfth transistor is coupled to the second terminal of the sixth transistor, and the control terminal of the other one of the eleventh transistor and the twelfth transistor is coupled to the supply voltage.

6. The single-ended-to-differential converter as claimed in claim 1, wherein the first control circuit further comprises:
a first switch, wherein the first switch has a first terminal coupled to the first control node, and a second terminal coupled to the ground voltage, and wherein the first switch is initially closed and then kept open so as to fine-tune a voltage level of the first control signal.

7. The single-ended-to-differential converter as claimed in claim, 1, wherein the second control circuit comprises:
a NOR gate, wherein the NOR gate has a first input terminal for receiving the first output signal, a second input terminal for receiving the second output signal, and an output terminal;
a fourteenth transistor, wherein the fourteenth transistor has a control terminal coupled to the output terminal of the NOR gate, a first terminal coupled to a current sink, and a second terminal coupled to a second control node, and wherein the second control node is arranged for outputting the second control signal; and
a second capacitor, wherein the second capacitor has a first terminal coupled to the second control node, and a second terminal coupled to a ground voltage.

8. The single-ended-to-differential converter as claimed in claim 7, wherein the second control circuit further comprises:
a second switch, wherein the second switch has a first terminal coupled to the second control node, and a second terminal coupled to a supply voltage, and wherein the second switch is initially closed and then kept open so as to fine-tune a voltage level of the second control signal.

9. The single-ended-to-differential converter as claimed in claim 1, wherein the first converting circuit comprises one tunable inverter and N pairs of fixed inverters, and the second converting circuit comprises (N+1) pairs of fixed inverters, wherein N is a positive integer.

10. The single-ended-to-differential converter as claimed in claim 9, wherein the tunable inverter comprises:
   a first transistor, wherein the first transistor has a control terminal, a first terminal coupled to a supply voltage, and a second terminal;
   a second transistor, wherein the second transistor has a control terminal, a first terminal coupled to the second terminal of the first transistor, and a second terminal coupled to a first output node, wherein the first output node is arranged for outputting the first output signal;
   a third transistor, wherein the third transistor has a control terminal, a first terminal, and a second terminal coupled to the first output node; and
   a fourth transistor, wherein the fourth transistor has a control terminal, a first terminal coupled to a ground voltage, and a second terminal coupled to the first terminal of the third transistor,
   wherein the control terminal of one of the first transistor and the second transistor is coupled to the input signal, and the control terminal of the other one of the first transistor and the second transistor is coupled to the first output signal,
   wherein the control terminal of one of the third transistor and the fourth transistor is coupled to the input signal, and the control terminal of the other one of the third transistor and the fourth transistor is coupled to the second output signal.

11. The single-ended-to-differential converter as claimed in claim 9, wherein for each of the pairs of fixed inverters, one of the pair of fixed inverters comprises:
   a fifth transistor, wherein the fifth transistor has a control terminal, a first terminal coupled to a supply voltage, and a second terminal;
   a sixth transistor, wherein the sixth transistor has a control terminal, a first terminal coupled to the second terminal of the fifth transistor, and a second terminal;
   a seventh transistor, wherein the seventh transistor has a control terminal, a first terminal, and a second terminal coupled to the second terminal of the sixth transistor; and
   an eighth transistor, wherein the eighth transistor has a control terminal, a first terminal coupled to a ground voltage, and a second terminal coupled to the first terminal of the seventh transistor,
   wherein the control terminal of one of the fifth transistor and the sixth transistor is coupled to the input signal, and the control terminal of the other one of the fifth transistor and the sixth transistor is coupled to the ground voltage,
   wherein the control terminal of one of the seventh transistor and the eighth transistor is coupled to the input signal, and the control terminal of the other one of the seventh transistor and the eighth transistor is coupled to the supply voltage.

12. The single-ended-to-differential converter as claimed in claim 9, wherein for each of the pairs of fixed inverters, another one of the pair of fixed inverters comprises:
   a ninth transistor, wherein the ninth transistor has a control terminal, a first terminal coupled to the supply voltage, and a second terminal;
   a tenth transistor, wherein the tenth transistor has a control terminal, a first terminal coupled to the second terminal of the ninth transistor, and a second terminal coupled to a second output node, and wherein the second output node is arranged for outputting the second output signal;
   an eleventh transistor, wherein the eleventh transistor has a control terminal, a first terminal, and a second terminal coupled to the second output node; and
   a twelfth transistor, wherein the twelfth transistor has a control terminal, a first terminal coupled to the ground voltage, and a second terminal coupled to the first terminal of the eleventh transistor,
   wherein the control terminal of one of the ninth transistor and the tenth transistor is coupled to the second terminal of the sixth transistor, and the control terminal of the other one of the ninth transistor and the tenth transistor is coupled to the ground voltage,
   wherein the control terminal of one of the eleventh transistor and the twelfth transistor is coupled to the second terminal of the sixth transistor, and the control terminal of the other one of the eleventh transistor and the twelfth transistor is coupled to the supply voltage.

13. The single-ended-to-differential converter as claimed in claim 1, wherein the LVDS driving circuit comprises two output terminals and four transistors, wherein the two output terminals of the LVDS driving circuit are coupled to a supply voltage via two of the four transistors, respectively, and the two output terminals of the LVDS driving circuit are coupled to a ground voltage via the other two of the four transistors, respectively, and wherein two of the four transistors of the LVDS driving circuit are controlled by the first output signal, and the other two of the four transistors of the LVDS driving circuit are controlled by the second output signal.

* * * * *